(12) United States Patent
Rand et al.

(10) Patent No.: US 9,985,251 B2
(45) Date of Patent: May 29, 2018

(54) PROCESS FOR FABRICATING A POROUS FILM IN A SCATTERING LAYER

(71) Applicant: The Trustees of Princeton University, Office of Technology and Trademark Licensing, Princeton, NJ (US)

(72) Inventors: Barry P. Rand, Princeton, NJ (US); Tae-Wook Koh, Princeton, NJ (US)

(73) Assignee: The Trustees of Princeton University, Office of Technology and Trademark Licensing, Princeton, NJ (US)

( * ) Notice: Subject to any disclaimer, the term of this patent is extended or adjusted under 35 U.S.C. 154(b) by 0 days. days.

(21) Appl. No.: 14/880,781

(22) Filed: Oct. 12, 2015

(65) Prior Publication Data

US 2016/0118627 A1  Apr. 28, 2016

Related U.S. Application Data

(60) Provisional application No. 62/184,002, filed on Jun. 24, 2015, provisional application No. 62/069,397, filed on Oct. 28, 2014.

(51) Int. Cl.
*H01L 51/52* (2006.01)
*H01L 51/56* (2006.01)

(52) U.S. Cl.
CPC .......... *H01L 51/5268* (2013.01); *H01L 51/56* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 6,426,372 B1 * | 7/2002 | Minami | C08J 9/26 521/61 |
| 7,957,621 B2 | 6/2011 | Zhang et al. | |
| 8,033,706 B1 * | 10/2011 | Kelly | G02B 6/0036 362/307 |
| 8,179,034 B2 | 5/2012 | Potts et al. | |

(Continued)

OTHER PUBLICATIONS

Takeichi, Tsutomu, Yutaka Yamazaki, Akihiro Ito, and Min Zuo. "Preparation and Properties of Porous Polyimide Films Prepared by the Pyrolysis of Poly(urethane-imide) Films." Journal of Photopolymer Science and Technology 12.2 (1999): 203-08.*

(Continued)

*Primary Examiner* — Joseph Schoenholtz
(74) *Attorney, Agent, or Firm* — Moser Taboada

(57) ABSTRACT

The present invention is directed towards a thin-film device. In one embodiment, the thin film device comprises a scattering layer comprising a substrate, the substrate comprising a plurality of voids, and a device stock formed atop the scattering layer, wherein the plurality of voids have a high refractive index as compared to a refractive index of the substrate. Another embodiment of the present invention is directed towards a process for fabricating a thin-film device, the process comprising dissolving a precursor in an organic solvent to form a solution, coating the solution onto a substrate to form a film, immersing the film and the substrate into an antisolvent bath for a first period of time so as to form a plurality of air voids within the film, removing the film and substrate from the anti-solvent bath to dry and cure for a second period of time to create a porous film adhered to the substrate, the porous film and the substrate forming a scattering layer.

5 Claims, 17 Drawing Sheets

(56) References Cited

U.S. PATENT DOCUMENTS

| | | | |
|---|---|---|---|
| 8,982,468 B2* | 3/2015 | Petaja | G02B 5/0247 359/599 |
| 9,508,864 B2* | 11/2016 | Yamazaki | H01L 29/7869 |
| 2004/0027062 A1* | 2/2004 | Shiang | H01L 51/5262 313/506 |
| 2010/0110551 A1 | 5/2010 | Lamansky et al. | |
| 2010/0118243 A1* | 5/2010 | Majumdar | H01L 51/0021 349/122 |
| 2011/0024779 A1* | 2/2011 | Nakamura | B82Y 20/00 257/98 |
| 2012/0207999 A1* | 8/2012 | Ohya | C08J 5/18 428/220 |
| 2012/0244433 A1* | 9/2012 | Yamasaki | H01M 4/0404 429/211 |
| 2012/0256197 A1* | 10/2012 | Matsuhisa | H01L 51/5092 257/79 |
| 2013/0133739 A1* | 5/2013 | Kohnke | H01L 31/0216 136/256 |
| 2013/0170224 A1* | 7/2013 | Huang | H01L 51/5275 362/311.02 |
| 2013/0181195 A1* | 7/2013 | Cho | H01L 51/5203 257/40 |
| 2013/0181197 A1* | 7/2013 | Lee | H01L 33/60 257/40 |
| 2014/0014937 A1* | 1/2014 | Ide | H01L 51/5044 257/40 |
| 2014/0017145 A1* | 1/2014 | Aizenberg | G01N 21/774 422/425 |
| 2014/0175474 A1* | 6/2014 | Han | H01L 33/007 257/94 |
| 2014/0191266 A1* | 7/2014 | Lee | H01L 51/442 257/98 |
| 2014/0326986 A1* | 11/2014 | Zhou | H01L 51/5096 257/40 |
| 2015/0200333 A1* | 7/2015 | Okumoto | H01L 51/003 257/79 |
| 2016/0093784 A1* | 3/2016 | Kawano | H01L 33/62 257/98 |
| 2016/0155990 A1* | 6/2016 | Han | H01L 51/5275 428/312.6 |
| 2016/0172591 A1* | 6/2016 | Kim | H01L 51/0096 257/40 |

OTHER PUBLICATIONS

Bathelt, R., D. Buchhauser, C. Gärditz, R. Paetzold, and P. Wellmann. "Light Extraction from OLEDs for Lighting Applications through Light Scattering." Organic Electronics 8.4 (2007): 293-99.*

Ando, Shinji. "Optical Properties of Fluorinated Polyimides and Their Applications to Optical Components and Waveguide Circuits." Journal of Photopolymer Science and Technology 17.2 (2004): 219-32.*

Ishizaka, Takayuki, and Hitoshi Kasai. Fabrication of Polyimide Porous Nanostructures for Low-K materials. INTECH Open Access, 2012.*

Koh, Tae-Wook, Joshua A. Spechler, Kyung Min Lee, Craig B. Arnold, and Barry P. Rand. "Enhanced Outcoupling in Organic Light-Emitting Diodes via a High-Index Contrast Scattering Layer." ACS Photonics 2.9 (2015): 1366-372.*

Saxena, Kanchan, V.k. Jain, and Dalip Singh Mehta. "A Review on the Light Extraction Techniques in Organic Electroluminescent Devices." Optical Materials 32.1 (2009): 221-33.*

Kim, Soohyun, Keon-Soo Jang, Hee-Dok Choi, Seung-Hoon Choi, Seong-Ji Kwon, Il-Doo Kim, Jung Lim, and Jae-Min Hong. "Porous Polyimide Membranes Prepared by Wet Phase Inversion for Use in Low Dielectric Applications." International Journal of Molecular Sciences 14.5 (2013): 8698-707.*

Lin, Hoang-Yan, Jiun-Haw Lee, Mao-Kuo Wei, Ching-Liang Dai, Chia-Fang Wu, Yu-Hsuan Ho, Hung-Yi Lin, and Tung-Chuan Wu. "Improvement of the Outcoupling Efficiency of an Organic Light-emitting Device by Attaching Microstructured Films." Optics Communications 275.2 (2007): 464-69.*

Toan, N.N., "Spin-On Glass Materials and Applications in Advanced IC Technologies", Thesis University of Twente, @Feb. 6, 1999.*

Filmetrics, downloaded from URL < http://www.filmetrics.com/refractive-index-database/Polyimide+-+n%3D1.79/Polymer---n=1.79> on Oct. 31, 2016.*

Kitamura, Rei, Laurent Pilon, and Miroslaw Jonasz. "Optical Constants of Silica Glass from Extreme Ultraviolet to Far Infrared at near Room Temperature." Applied Optics 46.33 (2007): 8118.*

Filmetrics downloaded from URL< http://www.filmetrics.com/refractive-index-database/Polyimide+-+n%3D1.79/Polymer---n=1.79> on Oct. 13, 2016.*

Definition of substrate downloaded from URL<http://www.dictionary.com/browse/substrate> on Sep. 20, 2017.*

Lim et al. "Simple Fabrication of a Three-Dimensional Porous Polymer Film as a Diffuser for Organic Light Emitting Diodes." Nanoscale, 2014, 6, pp. 14446-14452.

* cited by examiner

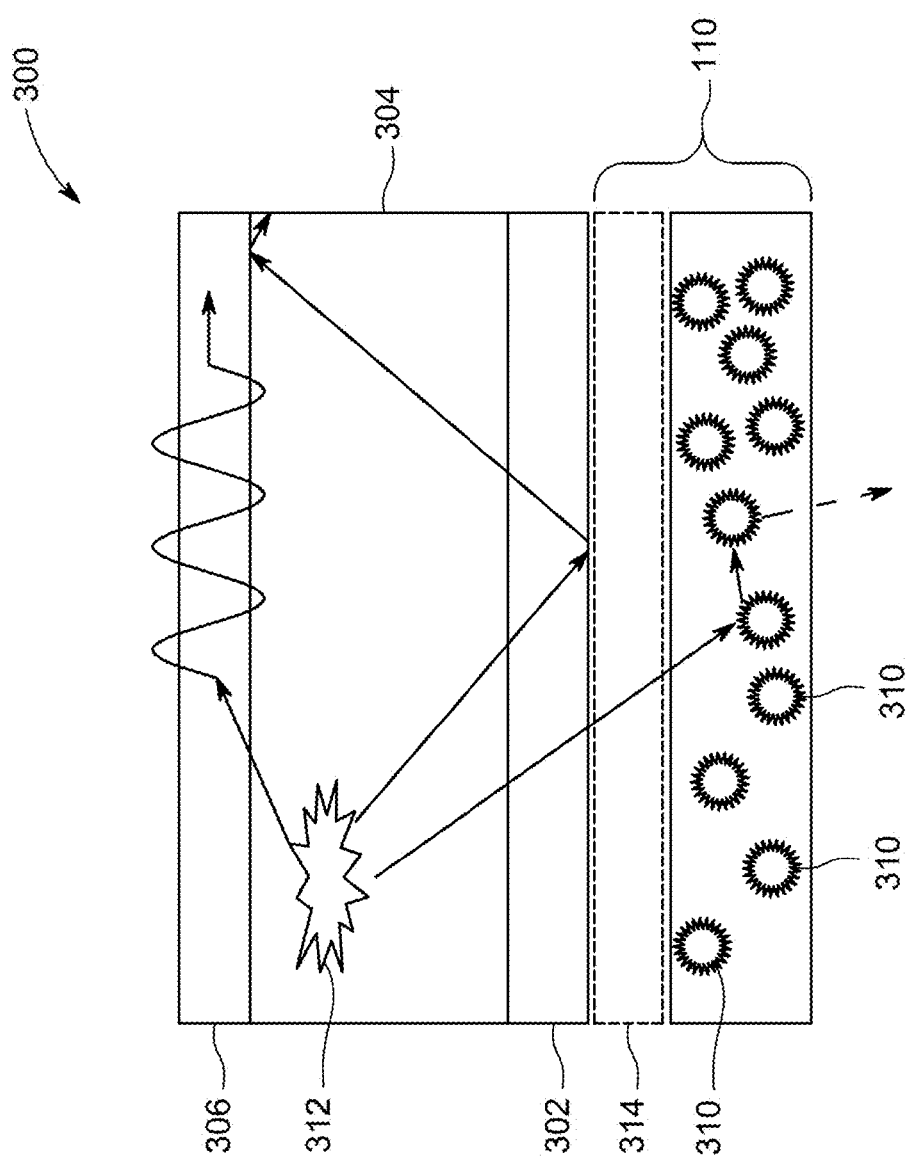

PROCESS FOR FABRICATING A POROUS FILM IN A SCATTERING LAYER

REFERENCE TO RELATED APPLICATIONS

This application claims the benefit of priority to U.S. Provisional Application Ser. No. 62/184,002 filed on Jun. 24, 2015 entitled "Light Extraction Layers For Organic Light-Emitting Diodes Based on Voids as Scattering Centers" and U.S. Provisional Application Ser. No. 62/069,397 filed on Oct. 28, 2014 entitled "Light Extraction Layers For Organic Light-Emitting Diodes Based on Voids as Scattering Centers", both of which are herein incorporated by reference in their entireties.

BACKGROUND

Field

Thin-film based photonic devices such as light-emitting diodes (LEDs) and organic light-emitting diodes (OLEDs) are being increasingly used in commercial lighting applications. The development of materials with improved transport properties, chemical and thermal stabilities, and high luminescence quantum yields has resulted in several important breakthroughs in device performance, while a deeper understanding of the device physics and interfacial properties has allowed engineering devices to realize internal quantum efficiencies near the theoretical maximum of 100%. While the device electrical efficiency is approaching its limit, there is still significant room for improvement in the optical efficiency, often called the outcoupling efficiency or light extraction efficiency. Outcoupling efficiency can be calculated with the aid of advanced modeling techniques, which show that only approximately 20 to 30% of the emitted photons escape a non-cavity planar OLED fabricated on a conventional glass substrate. The planarity of the device and the refractive indices of the thin-film stack are closely associated with this low outcoupling efficiency for OLEDs.

A continuing need therefore exists to overcome low outcoupling efficiency in order to fully convert the input electrical power into optical power.

SUMMARY

The Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments consistent with the present invention are directed towards thin-film devices with a scattering layer. In some embodiments, the thin film device comprises a device stack and a scattering layer, the scattering layer comprising a substrate and a host medium laminated to the substrate, the host medium comprising at least a plurality of voids, wherein the host medium has a high refractive index as compared to a refractive index of the air voids. Another embodiment of the present invention is directed towards a process for fabricating a scattering layer of a thin-film device. The process comprises dissolving a precursor in an organic solvent to form a solution, coating the solution onto a substrate to form a film and immersing the film and the substrate into an antisolvent bath for a first period of time so as to form a plurality of air voids within the film. The film and substrate are then removed from the anti-solvent bath to dry and cure for a second period of time to create a porous film adhered to the substrate, the porous film and the substrate forming a scattering layer.

In some embodiments, a process for fabricating a porous film in a scattering layer may include agitating a polymer and solvent solution to introduce air bubbles in the solution, dispensing the solvent solution into a flat substrate, and curing the solvent solution to trap the air bubbles as air voids, forming a porous film as a scattering layer with the air voids.

Other embodiments include an organic light-emitting diode, comprising: an anode, a cathode, a layer of organic materials situated between said anode and said cathode and a transparent, high index of refraction scattering layer embedded with ultra-low index voids upon which at least one of the anode and the cathode are deposited.

Other and further embodiments of the present invention are described below.

BRIEF DESCRIPTION OF THE DRAWINGS

FIG. 3A depicts a thin-film device with a scattering layer in accordance with exemplary embodiments of the present invention;

Figure 1:
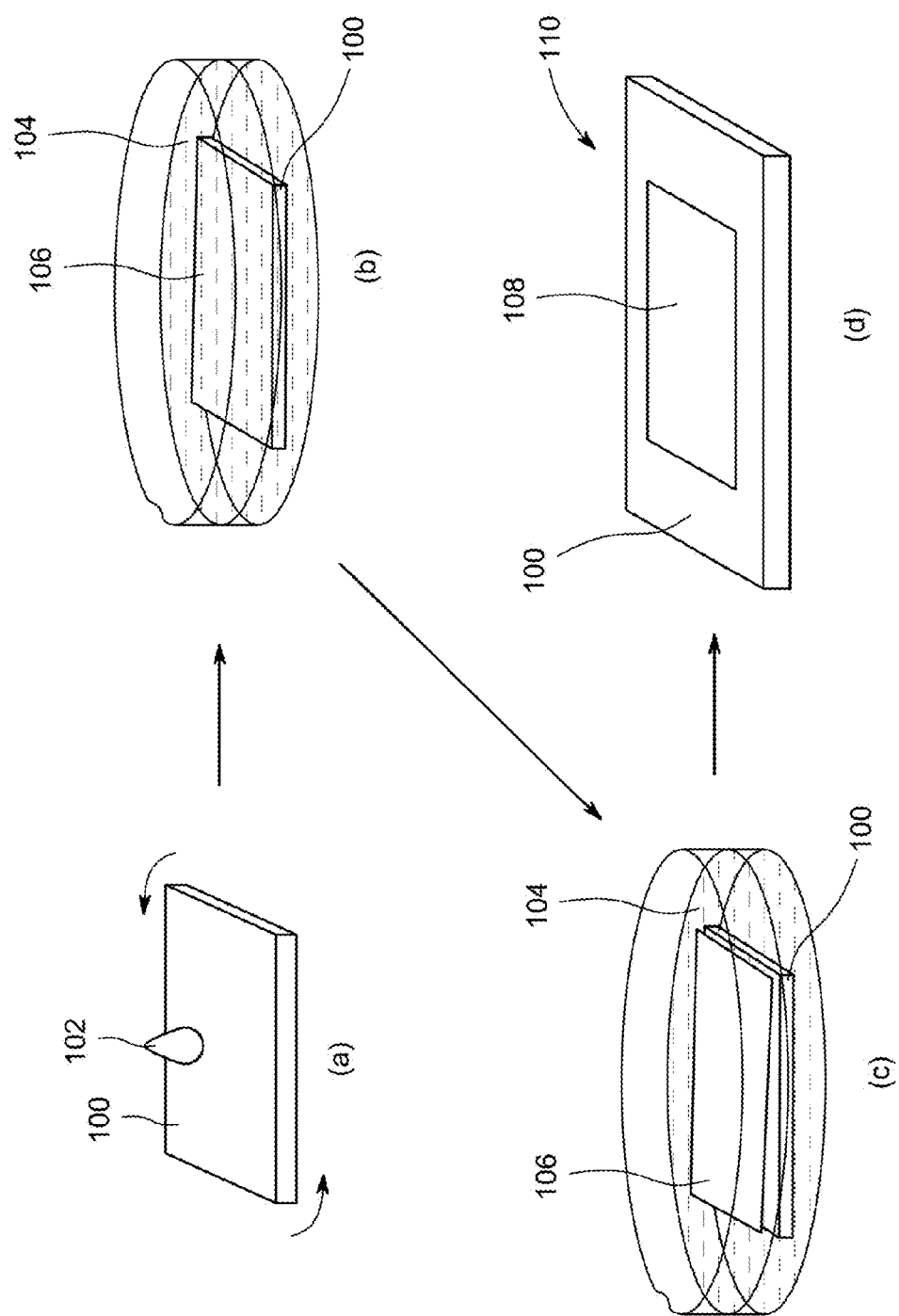
FIG. 1 depicts a fabrication scheme for a scattering layer using scalable phase inversion according to exemplary embodiments of the present invention.

While the components and systems are described herein by way of example for several embodiments and illustrative drawings, it should be understood that the drawings and detailed description thereto are not intended to limit embodiments to the particular form disclosed. Rather, the intention is to cover all modifications, equivalents and alternatives falling within the spirit and scope of the components and systems defined by the appended claims. Any headings used herein are for organizational purposes only and are not meant to limit the scope of the description or the claims. As used herein, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

Described herein are thin scattering films (e.g., polyimide films) adapted for integration with a wide range of display and lighting devices. Although examples described in detail herein are presented in the context of novel optical fluorescence-based chemical and biochemical sensors and multi-analyte detection and imaging systems, such examples are presented to highlight the applicability of low-cost materials and simple fabrication techniques to the implementation of such systems.

According to some embodiments of the present disclosure, a device with a thin flexible scattering film is provided where the refractive index contrast between the host medium (e.g., the substrate) and high-index nano/microparticles induces scattering that redistributes the direction of light propagation, increasing outcoupling efficiency of light. Additionally, several methods of fabricating the flexible polymeric scattering layer are provided that do not utilize costly patterning, etching, or molding processes. Accordingly, these methods of fabrication are ideal for mass production of commercial products such as large-scale lighting panels, displays and the like. Those of ordinary skill in the art will recognize that the thin film scattering layer refers to a film that cannot support itself and is approximately from several microns thick to 10 s of nm thick. Thin films, as referred to in embodiments of the present invention, are generally not freestanding and are usually built upon another structure, e.g., a glass or plastic substrate or other device. The scattering layer along with the substrate is used in an OLED device or LEDs based on quantum dye emitters, made from solutions and inks and vacuum processes, but generally excludes LEDs based on inorganic III-V semiconductors which are fabricated via conventional lithography and crystal processes (e.g., GaN on sapphire). The thin film scattering layer described in embodiments of the present invention is generally developed for use commercially in lighting and display technologies. In some embodiments, the air voids within the thin film scattering layer are generated to be ideal for use in OLEDs in displays.

In some embodiments consistent with the present invention, high-index porous films are coupled to lower index substrates. With polyimide as a high-index host medium and air voids as scattering centers, porous polyimide (p-PI) layers applied to green and broadband OLEDs, for example show outcoupling efficiency enhancements of approximately 65% and 60%, respectively. These enhancements are achievable because of the large refractive index difference (>0.5) between the high-index porous film and the low-index air voids. Other factors that help achieve the aforementioned efficiencies include using a porous film having a refractive index that is greater than that of the glass substrate, which is beneficial for extracting substrate-trapped light into a scattering layer. The air voids serving as scattering centers have, for example, an index of refraction as measured in the visible portion of the electromagnetic spectrum of less than about 1.5, preferably less than about 1.1, and more preferably about 1.0. With respect to void dimension as well as distribution of void size, an exemplary arrangement will contain a plurality of void shapes and sizes, from tens of nanometers to tens of microns. In some embodiments, the air voids are made of, for example, inert gas, ambient air, and the like with zero optical absorption. The use of non-physical scattering particles results in lower fabrication cost.

In addition to the enhanced outcoupling efficiency, excellent color consistency between viewing angles of 0° and 60° is also confirmed via a small |Δ(x, y)| shift of (0.001, 0.000) for a prototypical while OLED (WOLED) device. An optical simulation based on power spectral density theory suggests that utilizing a substrate with a higher index compared with glass would lead to conversion of the wave-guided mode into the substrate-trapped mode, which could be readily recovered by the proposed high-index scattering layer.

FIG. 1 illustrates a fabrication scheme for a scattering layer using scalable phase inversion according to exemplary embodiments of the present invention.

The substrate 100 is made of glass, plastic, or the like. Those of ordinary skill in the art will recognize that the substrate can be made of many different materials and may be flexible or rigid. In some embodiments, the refractive index of the substrate 100 is greater than approximately 1.45 at wavelengths of light of approximately 300 nm to 500 nm. In exemplary embodiments, a solution 102 is applied to the substrate 100 via a coating process, such as spin-coating, forming a film 106. In some embodiments, the solution 102 may be a polymer/solvent solution, e.g., a precursor such as polyamic acid (PAA) dissolved in an organic solvent (e.g., N-Methyl-2-pyrrolidone, or, NMP). The organic solvent may have a similar density to a surrounding precursor, increasing uniformity of distribution of air voids due to a more randomized escape of solvent molecules/emulsions out of the film 106.

In exemplary embodiments, the solution 102 is spun onto the substrate at 1000 rpm for 90 seconds. While still wet, the film 106, along with substrate 100, is submerged in an antisolvent solution 104, in some instances water or alcohol. In exemplary embodiments, the anti-solvent solution 104 is a solution that does not dissolve the polymer composing the film 106, but is miscible with the organic solvent (e.g., NMP). The porous, hazy phase inversion film 106 floats to the air-antisolvent bath interface. Accordingly, a chain of monomers dissolves in the organic solvent with water emulsion across film 106, creating small pockets of air within the film 106. In exemplary embodiments, the substrate 100 and film 106 is immersed in the antisolvent solution 104 for two minutes.

Subsequently, the substrate 100 and film 106 are removed from the anti-solvent solution 104 to be dried and cured over a period of time causing solvent molecules and emulsions to escape and leave voids in the cured film 106 according to well-known processes. What results is a nanoporous structure, or, porous film 108 adhered to the substrate 100 with air voids as scattering centers, together forming scattering layer 110. In some embodiments, the air voids comprise 0.1% to 90% of the volume of the entire scattering layer 110. The air voids in the film 106 scatter incident light, increasing the outcoupling efficiency of a device that includes the scattering layer 110 in its stack. Examples of such devices are described in FIG. 3, FIG. 10 and FIG. 12. In one embodiment, the scattering layer 110 scatters light with a wavelength of approximate range between 300 to 1500 nm.

In some exemplary embodiments, after immersion in the antisolvent solution 104, the film 106 is transferred onto the backside of a substrate, dried under vacuum (e.g., at 50° C.) and then cured (e.g., at 160° C. and 360° C.) for a period (e.g., 20 minutes in a furnace). This causes thermal imidization of the film 106 to create the hazy, porous film 108.

Figure 2:
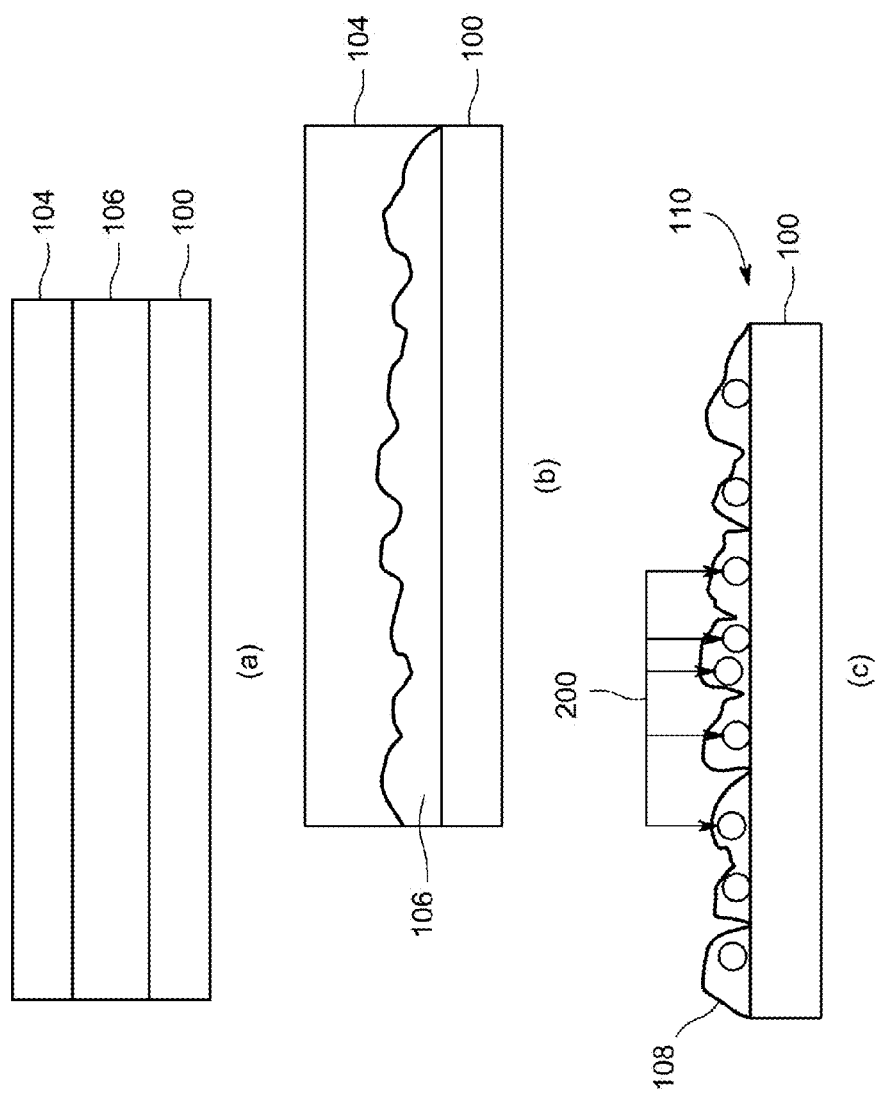
FIG. 2 depicts a side view of the formation of the scattering layer in accordance with exemplary embodiments of the present invention.

FIG. 2 depicts a side view of the formation of the scattering layer 110 in accordance with exemplary embodiments of the present invention. Immersion precipitation (e.g., the process described with reference to FIG. 1) relies on the interaction between solution 102 and the antisolvent solution 104, a liquid that does not dissolve the solid material in the solution 102. Furthermore, the antisolvent solution 104 must be miscible with the solution 102. Upon immersion of the solution 102 in a bath of the antisolvent solution 104, the solution 102 violently coagulates which causes formation of film 106. Under a particular choice of solution 102 and antisolvent solution 104, the coagulated film develops into a nanoporous structure, i.e., the porous film 108 with air voids 200. Those of ordinary skill in the art will recognize that voids 200 are merely representative of the actual scattering air voids in the porous film 108, but do not necessarily resemble the actual structure, size and pattern of the air voids that result from the process described in FIG. 1 in the porous film 108.

As disclosed above, the solution 102, in some embodiments is PAA and is dissolved in a polar aprotic solvent, N-methyl-2-pyrrolidone (NMP). Water serves as a suitable and scalable antisolvent for some embodiments. The film 106, or, phase inversion PAA layer, has a hazy appearance that persists after the thermal imidization (caused by curing) step that converts the film 106 into the porous film (e.g., porous poyimide, or, p-PI) 108. Those of ordinary skill in the art will recognize that the imidization creates a longer chain from shorter moieties in the solution 102. In some embodiments of the present invention, the described process of FIG. 1 requires only thin films of p-PI (approximately 100 nm to 100 µm, though other thicknesses are used in other embodiments, such as 2 µm). Due to their thin-ness, the films coagulate quickly and allow the process to complete within, approximately, two minutes of immersion time. In some embodiments, a thicker or thinner film may be used and the immersion time modified accordingly. The lamination of the PAA films to the substrate 100 does not require any additional surface treatment or adhesive, and after the thermal imidization process, the adhesion between the film 106 and the substrate 100 in the scattering layer 110 is highly robust.

FIG. 3 depicts a thin-film device 300 with a scattering layer in accordance with exemplary embodiments of the present invention.

The thin-film device 300 is an OLED device according to some embodiments. The device 300 comprises an anode 302 and a cathode 306. Between the anode and the cathode is a layer of organic materials 304. In some embodiments, positions of the cathode 306 and the anode 302 are interchangeable. The anode 302 is deposited atop scattering layer 110 with voids 310. The scattering layer 110 comprises a transparent, high index of refraction substrate as compared to the ultra-low index of refraction voids 310. In some embodiments, as described with respect to FIGS. 1, 10 and 12, the scattering layer 110 also comprises a flexible or rigid glass or plastic substrate 314.

Figure 3B:
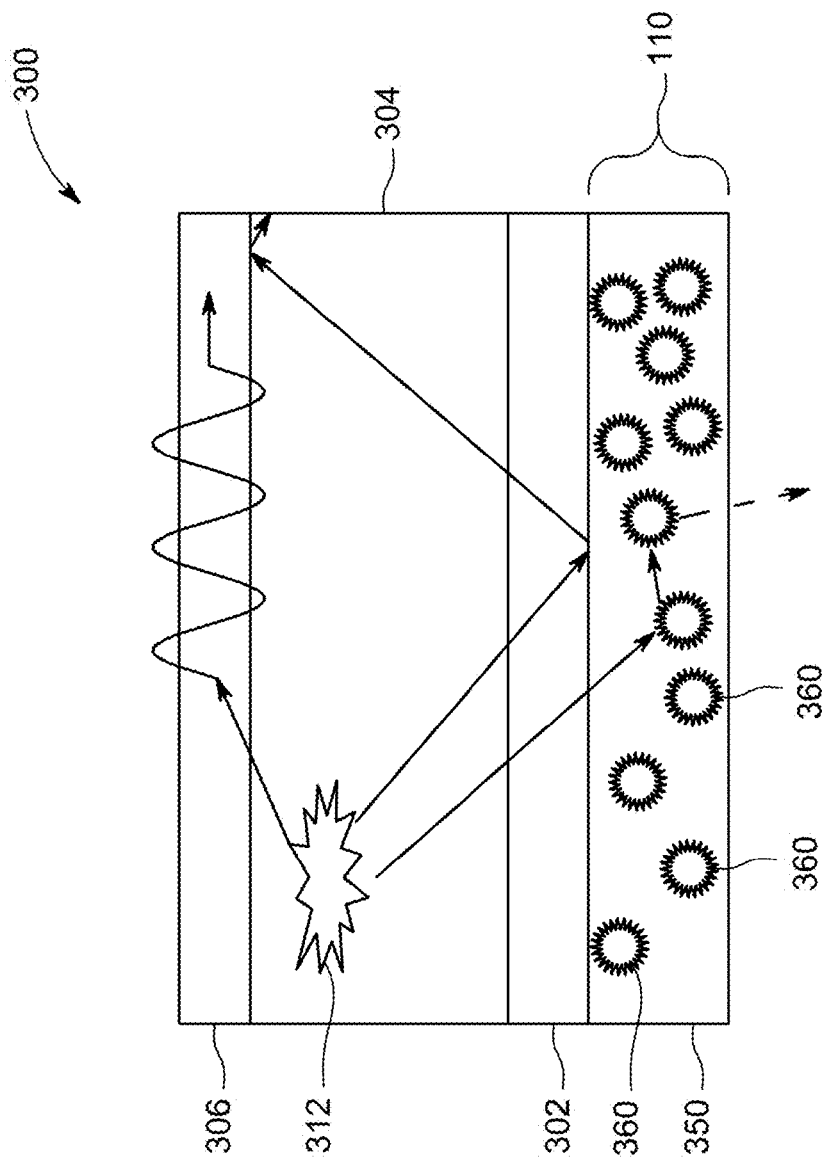
FIG. 3B depicts another thin-film device in accordance with exemplary embodiments of the present invention.

In some uses of the device 300, light 312 may become trapped in the organic materials 304. This trapped light 312 may be absorbed and/or reflected by the anode 302 and the cathode 306, decreasing outcoupling efficiency of the device 300. With the addition of the scattering layer 110, the light 312 is scattered by the air voids and exit the device 300 via the scattering layer 110. In FIG. 3B, the scattering layer 110 comprises a substrate 350 integrated with a plurality of air voids 360. In this embodiment, the substrate 350 is composed of a material with a significantly higher index of refraction than the plurality of air voids (e.g., approximately 1.5 difference).

Figure 4:
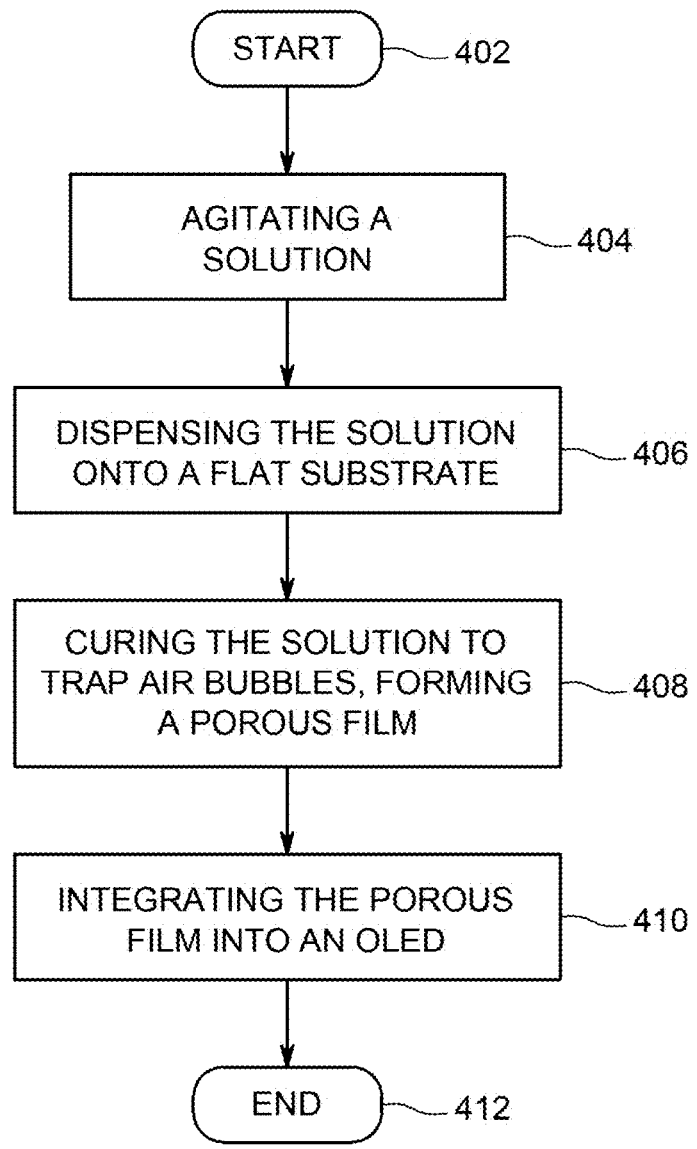
FIG. 4 depicts another process for fabricating a porous film in a scattering layer in accordance with exemplary embodiments of the present invention.

FIG. 4 depicts another process 400 for fabricating a porous film in a scattering layer in accordance with exemplary embodiments of the present invention.

The process 400 begins at step 402 and proceeds to step 404. At step 404, the process begins by rapid physical agitation of a viscous solution (e.g., the host material in the liquid phase). In some embodiments, this agitation is performed using stirring or ultrasonication using corresponding devices or mechanics. The agitation introduces a significant amount of air bubbles in the solution, which later form the air voids 200 depicted in FIG. 2.

The process 400 proceeds to step 406, where the solution is dispensed on a flat substrate. In step 408, the solution is rapidly cured without removing the air bubbles, forming voids within the porous film. At step 410, the cured porous film is integrated into an OLED, by, for example, being transferred and adhered to a substrate of an OLED or using the porous film as the substrate itself. The method terminates at step 412.

In exemplary embodiments, the viscous solution is composed of Polydimethylsiloxane (PDMS) formed with Sylgard 184 elastomer. The resultant PDMS film (porous film) is approximately 600 µm in thickness. In exemplary embodiments, the base and curing agent in the Sylgard 184 kit were mixed together, and various amounts of deionized water added with SDS (dodecyl sulfate sodium) were introduced into the solution. This final solution may be poured onto a flat surface and cured in a vacuum oven at 80° C. for two hours, for example. Completed porous films are optically diffusive owing to the voids and these porous films are attached to the substrate of organic light-emitting diodes to verify enhancement of device efficiency.

Figure 5:
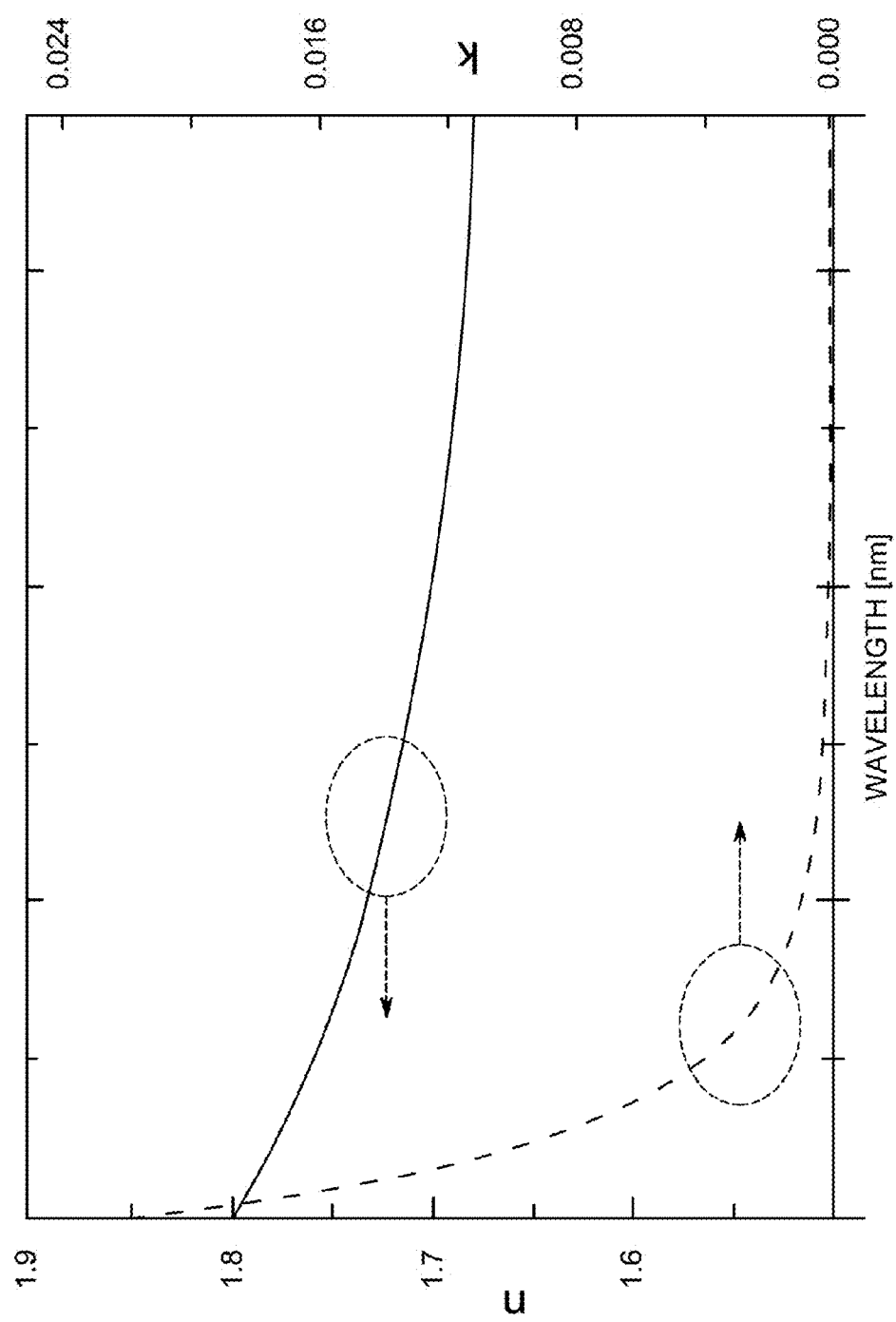
FIG. 5 illustrates a graphical plot of refractive indices measured on a film in accordance with exemplary embodiments of the present invention.

FIG. 5 illustrates a graphical plot of refractive indices measured on a film in accordance with exemplary embodiments of the present invention. The index and extinction coefficient are n=1.74 and k=0.002 respectively, at $\lambda$=475 nm, the emission peak for the blue phosphorescent emitter Bis[2-(4,6-difluorophenyl)pyridinato-$C^2$,N](picolinato) iridium(III), or commonly referred to as FIrpic), and 1.73 and 0.0008 at $\lambda$=510 nm, the emission peak for the green phosphorescent emitter Tris[2-phenylpyridinato-$C^2$,N] iridium(III), commonly referred to as Ir(ppy)3). The refractive indices at these two representative wavelengths are high enough to concentrate the optical power to the scattering layer, while k values are small enough to justify the use of this polyimide as the host medium without significant parasitic absorption.

Figure 6:
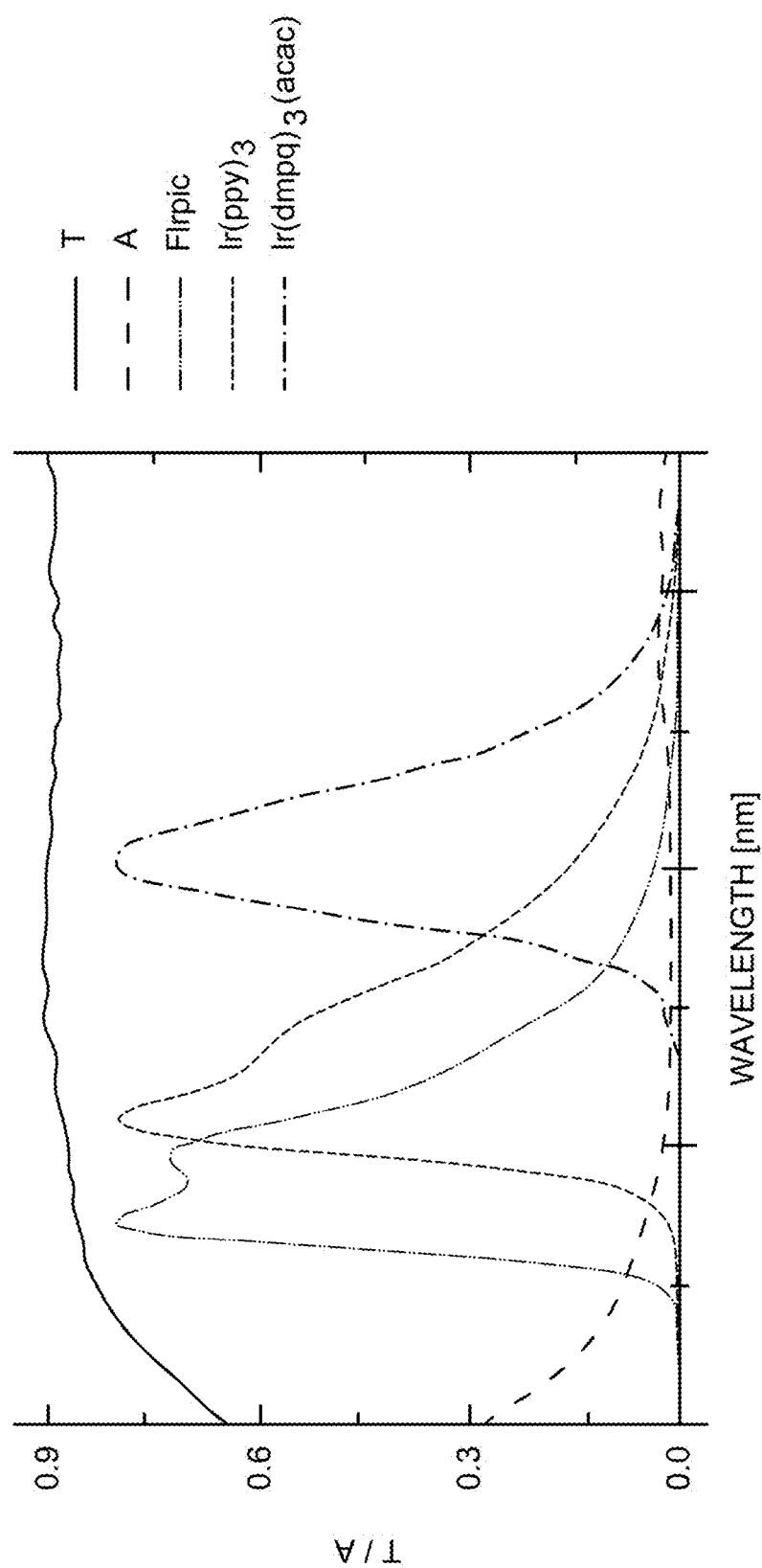
FIG. 6 illustrates a graphical plot of the absorption spectra of a polyimide film along with the intrinsic photoluminescence spectra of emitters used to construct a prototypical white OLED (WOLED) in accordance with exemplary embodiments of the present invention.

FIG. 6 illustrates a graphical plot of the absorption spectra of a polyimide film along with the intrinsic photoluminescence spectra of emitters used to construct a prototypical white OLED (WOLED) in accordance with exemplary embodiments of the present invention. In this plot, the measured transmission (T) and absorption (A) is shown for an 870 nm thick plain polyimide film fabricated using the same spin coating process described with respect to FIG. 1. The T and A are plotted together with intrinsic photoluminescence spectra of the blue (FIrpic), green (Ir(ppy)3), and red Bis(2-(3,5-dimethylphenyl)quinoline-C2,N')(acetylacetonato)iridium(III), commonly referred to as Ir(dmpq)2(acac) phosphorescent dopants used to construct OLEDs with the scattering layer 110 according to some embodiments of the present invention.

Figure 7:
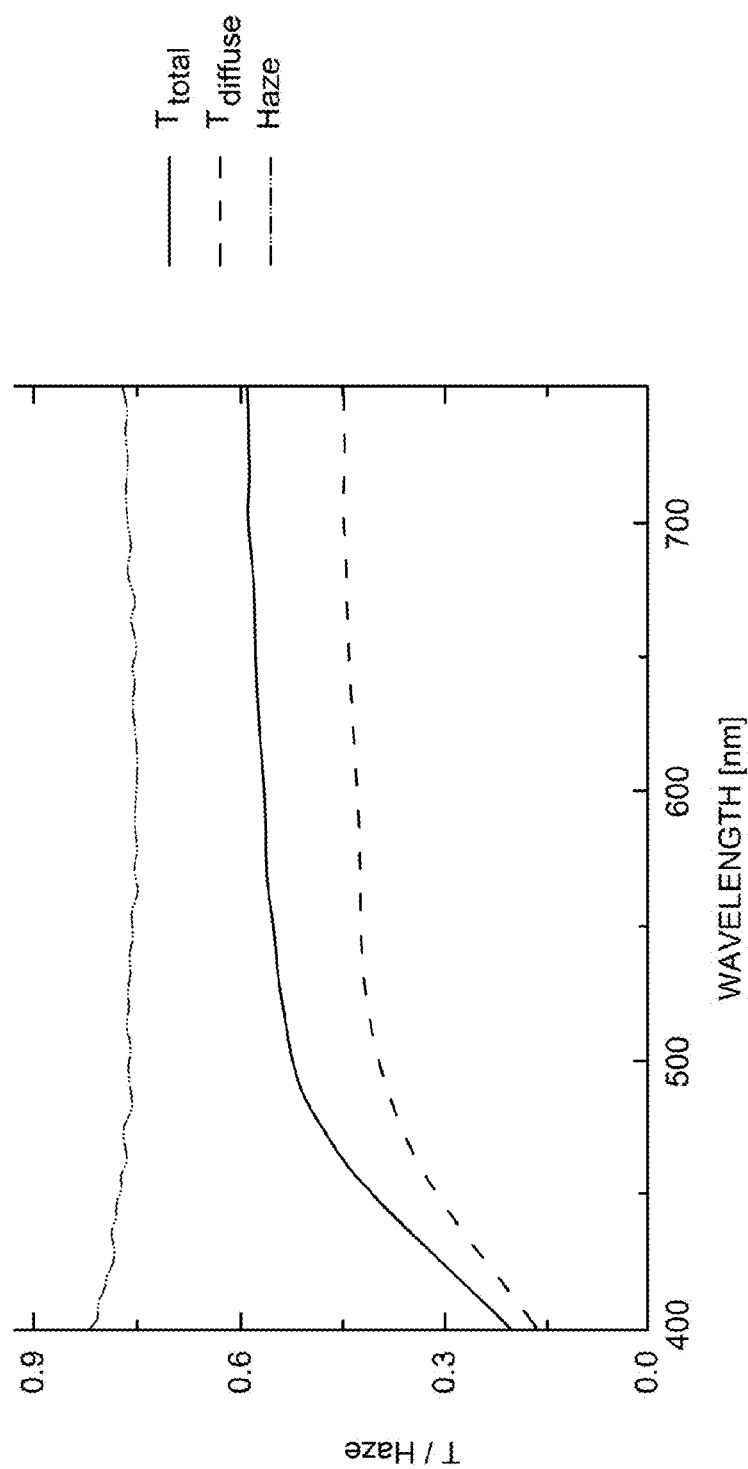
FIG. 7 illustrates a graphical plot of haze measurements and microscopy in accordance with exemplary embodiments of the present invention.

FIG. 7 illustrates a graphical plot of haze measurements and microscopy in accordance with exemplary embodiments of the present invention. FIG. 7 illustrates the measured total and diffuse transmission and calculated haze spectra for the p-PI illustrated and described in FIGS. 1 and 2.

Figure 8:
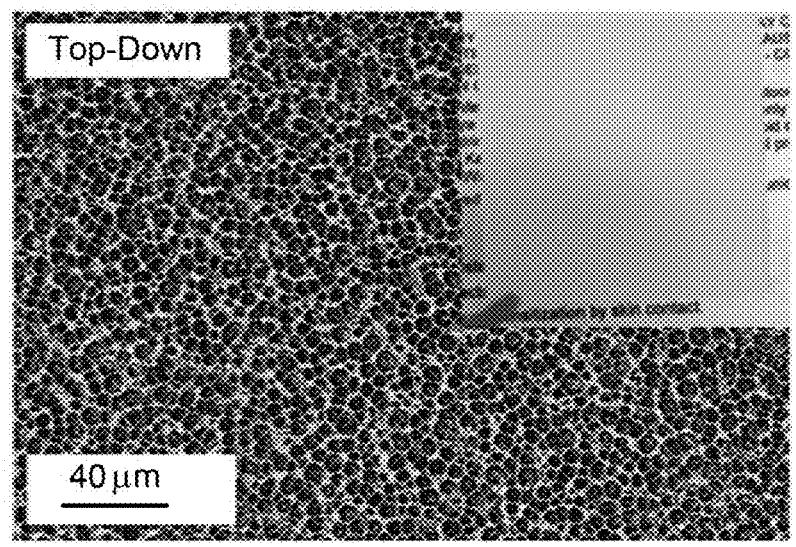
FIG. 8 is a top-down view of a confocal microscopy image of a polyimide film in accordance with exemplary embodiments of the present invention.

FIG. 8 is a top-down view of a confocal microscopy image of the scattering layer 110 in accordance with exemplary embodiments of the present invention. The structure shown in FIG. 9 of scattering layer 110 shows a highly porous framework characterized by voids of a few microns in extent. The haze of the scattering layer 110 is also visible. The majority of transmission through the scattering film is diffuse, leading to an average haze of 77% in the visible wavelength range.

Figure 9:
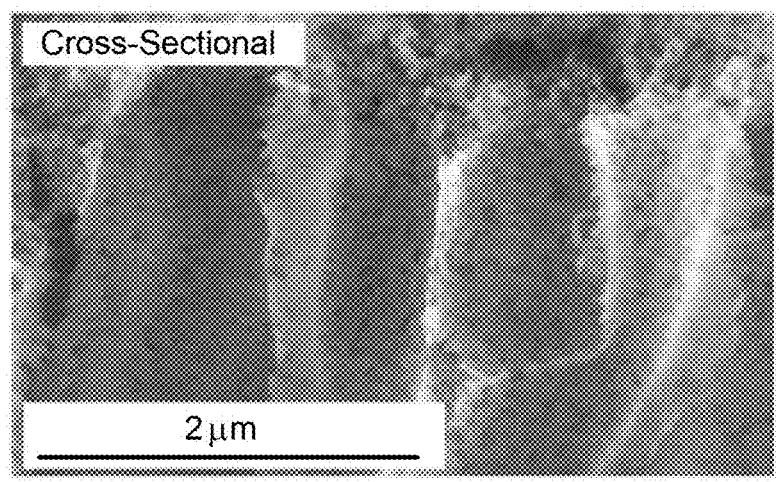
FIG. 9 is a cross-sectional view of a scanning electron microscopy image of a polyimide film in accordance with exemplary embodiments of the present invention.

FIG. 9 is a cross-sectional view of a confocal microscopy image of scattering layer 110 in accordance with exemplary embodiments of the present invention. FIG. 9 illustrates the hierarchical nature of the structure of porous film 118 consisting of nanoscale voids. Accordingly, the porous film 108 contains voids that are only a few microns in extent.

Figure 10:
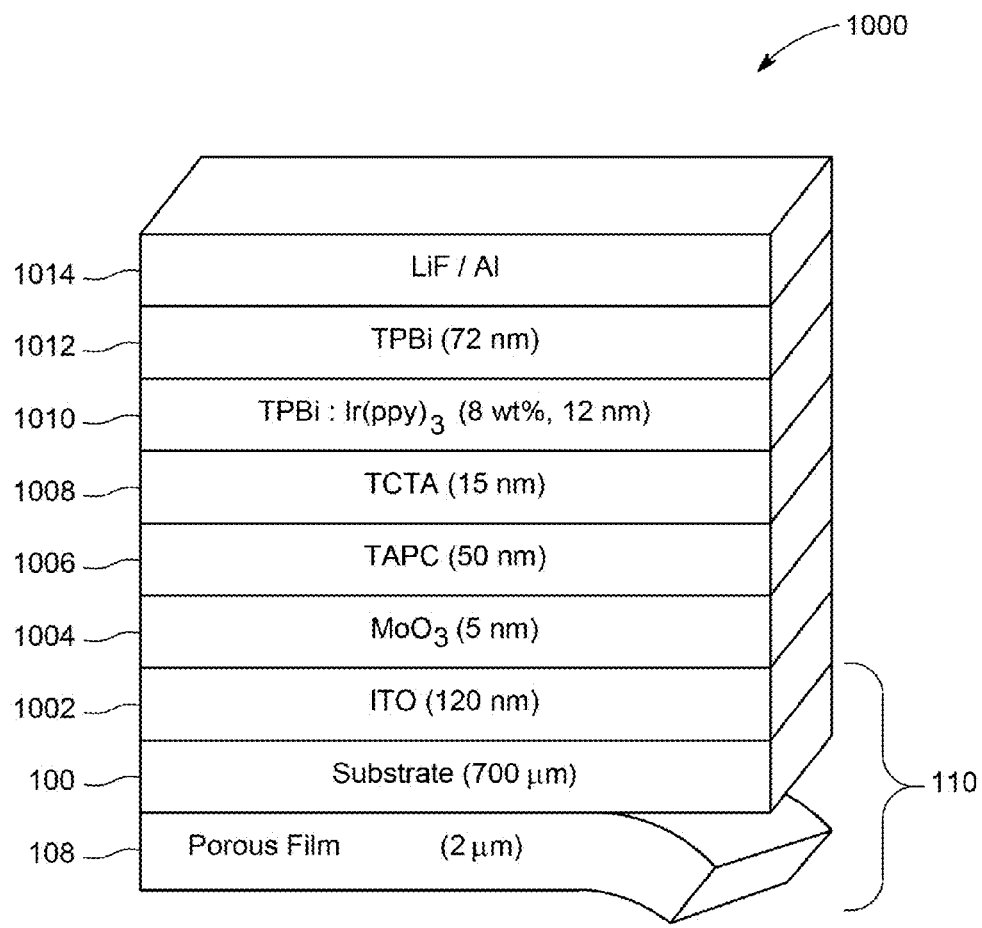
FIG. 10 depicts a device schematic containing the porous film in accordance with exemplary embodiments of the present invention.

FIG. 10 depicts a device schematic 1000 containing the scattering layer 110 in accordance with exemplary embodiments of the present invention.

The scattering layer 110 comprises the porous film layer 108 and substrate 100. In some embodiments, the porous film layer 108 is integrated with the substrate 100 (in this embodiment, formed of glass) and an indium tin oxide (ITO) layer 1002. A 5 nm $MoO_3$ layer 1004 is used as a hole injection layer to inject holes into the 50 nm thick Di-[4-(N,N-di-p-tolyl-amino)-phenyl]cyclohexane (TAPC) layer 1006 and 15 nm thick TCTA hole transport layers 1008. 2,2',2"-(1,3,5-Benzinetriyl)-tris(1-phenyl-1-H-benzimidazole) (TPBi) was used as both the phosphorescent host layer (12 nm) 1010 and the electron transport layer (72 nm) 1012, and Ir(ppy)$_3$ was doped into TPBi at 8% by weight in the phosphorescent host layer 1010. The thicknesses of TAPC hole transport layer 1006 and TPBi electron transport layers 1012 and 1012 maximize the sum of the outcoupled and substrate-trapped modes while maintaining a high-outcoupled mode portion in the green OLEDs on the basis of a power spectral density theory calculation. Layer 1014 is composed of LiF/Al as a cathode contact.

FIGS. 11A-11F illustrates several graphical plots comparing device performance between a control device and device 1000 with the polyimide scattering layer.

Figure 11A:
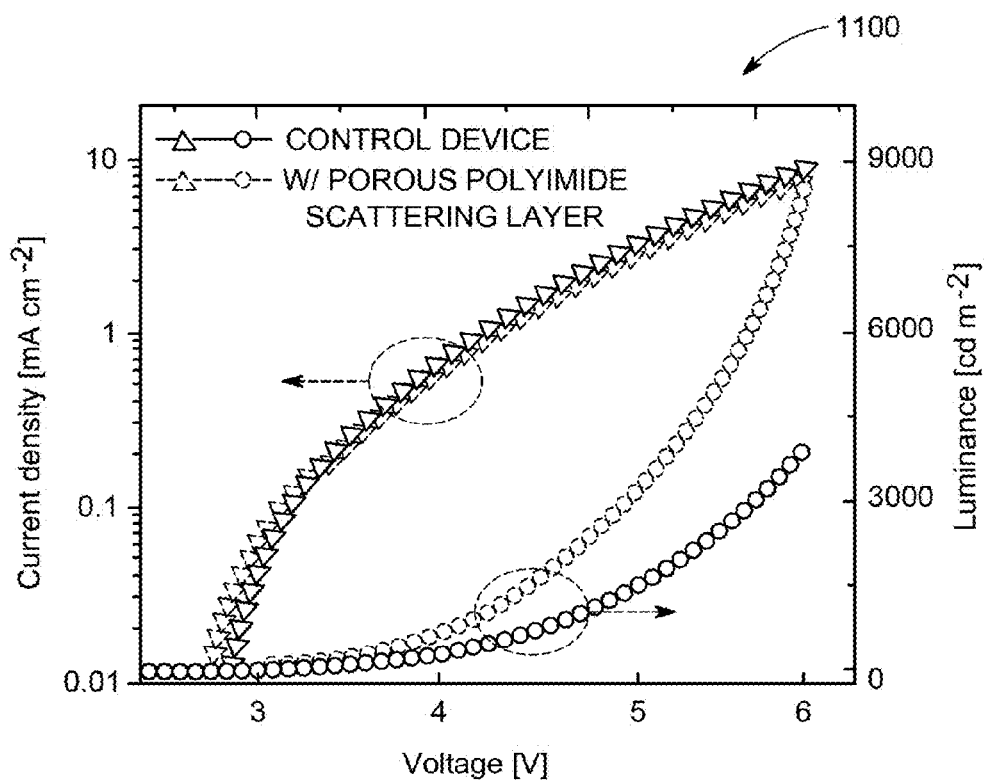
FIGS. 11A-11F illustrate graphical plots comparing device performance between a control device and a device with the polyimide scattering layer.
Figure 11B:
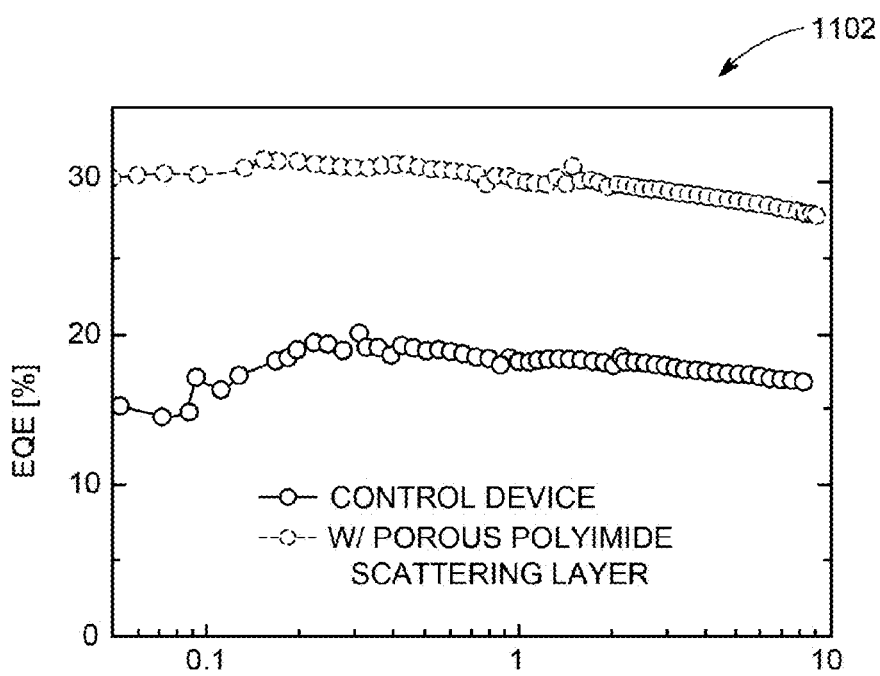
Figure 11C:
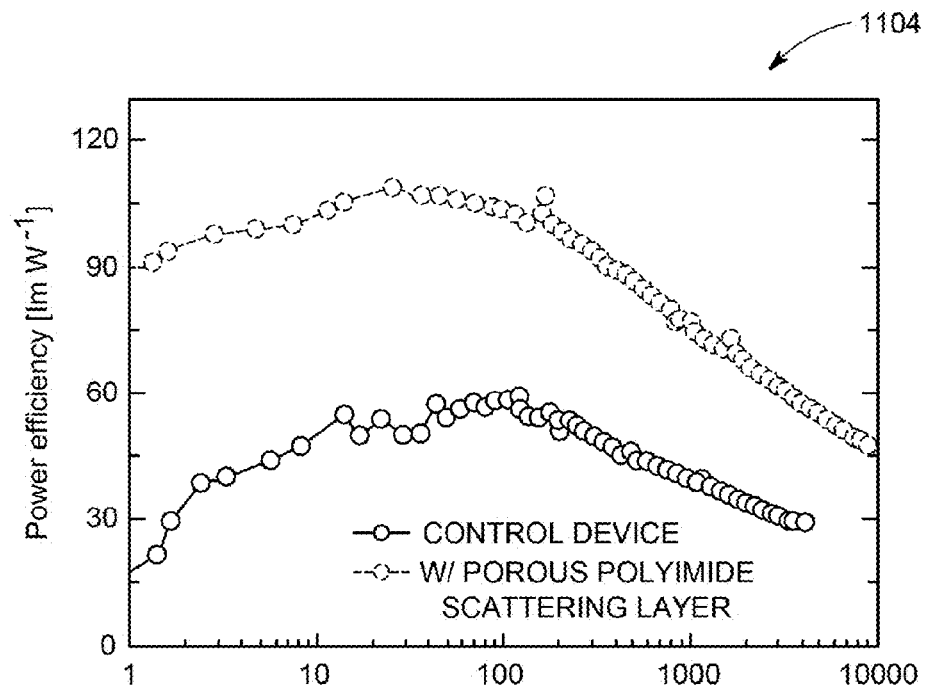

Plot 1100 in FIG. 11A graphs the current-density luminance voltage (J-L-V) curves for the device 1000 shown in FIG. 10. Identical J-V but different L-V graphs are shown for OLED 1000 with the porous film 108 and devices without the porous film 108.

Plots of the external quantum efficiency (EQE) versus J (plot 1102 in FIG. 11B) and the power efficiency (PE) versus L (plot 1104 in FIG. 11C) for device 1000 and a theoretical device without porous film 108 are shown. This presents a comprehensive overview of the outcoupling efficiency of device 1000 as compared to other devices. The EQE at a current density of 1 mA cm-2 was 18.2% for the control device (e.g., without a porous film 108) and increased to 30.0%, an enhancement of 65%, after the porous film 108 was applied to the substrate backside in device 1000. The PE was measured to be 58.5 lm W-1 for the control device at a forward luminance of 100 cd m-2, which increased to 103.6 lm W-1 with the aid of the porous film 108. This enhancement ratio of 77% for the power efficiency is higher than that for the EQE simply because the same forward luminance is reached at a lower driving voltage and thus a lower driving current for the device 1000.

Figure 11D:
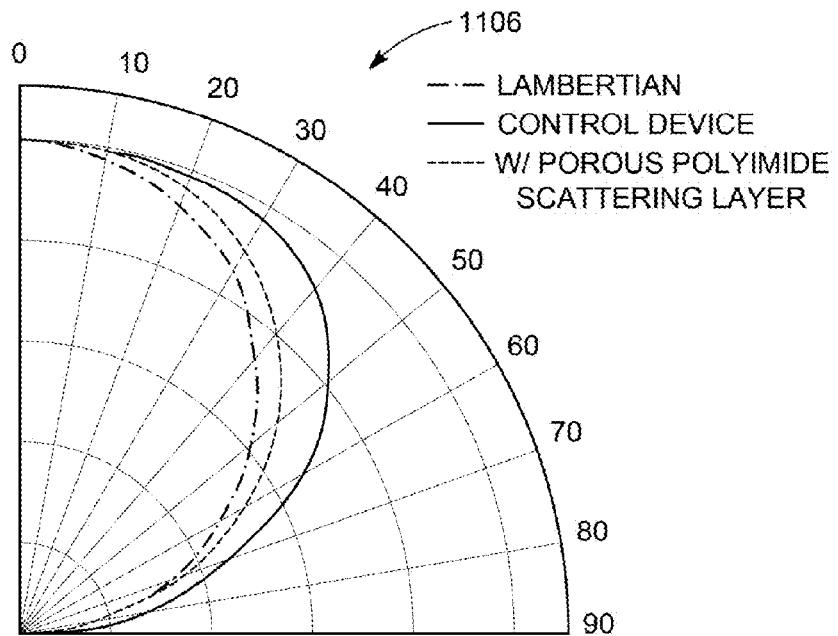

Normalized angular emission intensity profiles, normalized electroluminescence (EL) spectra, and Commission International de l'Eclairage (CIE) 1931 chromaticity coordinates at different viewing angles are provided in plot 1106 in FIG. 11D. Even though the ITO electrode has a relatively high transmittance and low reflectance, there is nevertheless a weak microcavity effect, as evidenced by the fact that the angular intensity profile is slightly wider than Lambertian. Additionally, there is a slight increase in the height of the dominant emission peak of Ir(ppy)3 together with a narrowing of the long-wavelength tail as a function of viewing angle. After application of the p-PI scattering layer, the angular intensity adopts a nearly Lambertian profile.

Figure 11E:
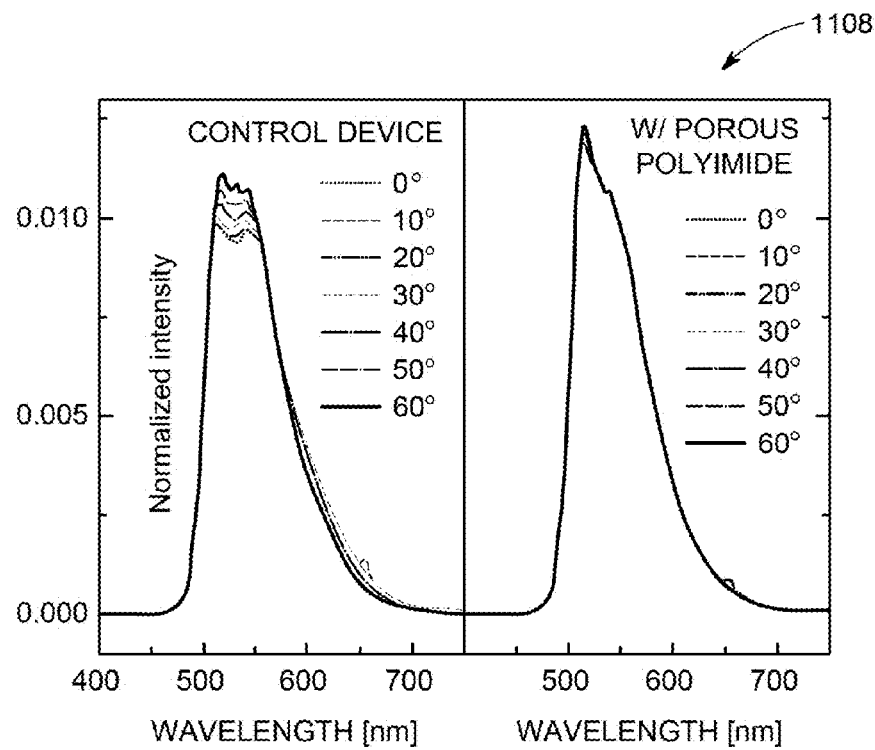
Figure 11F:
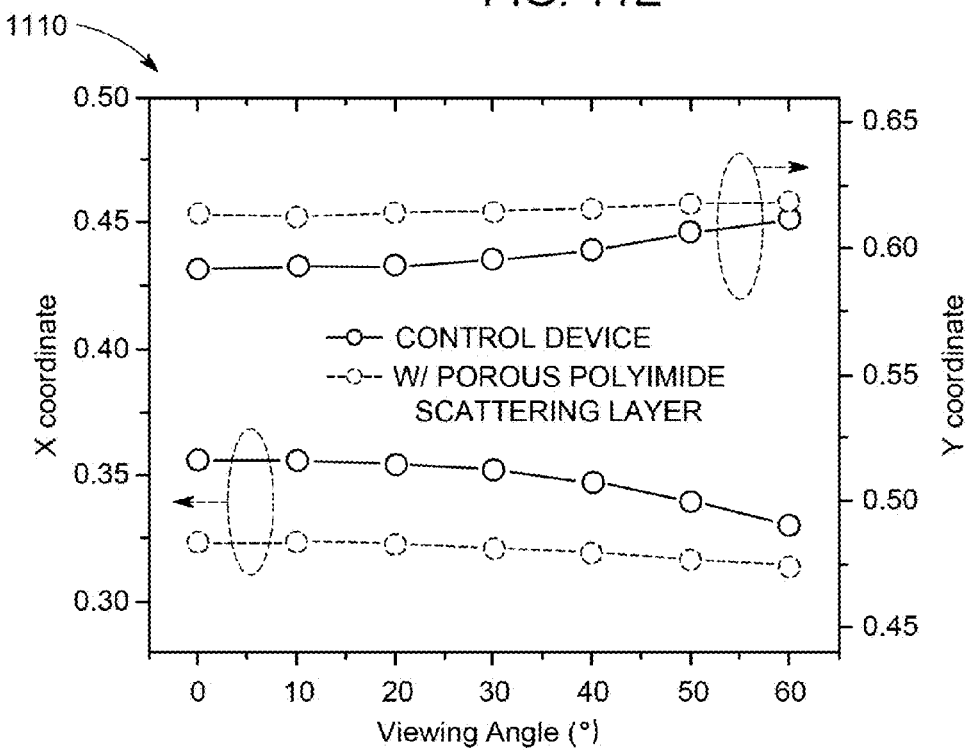

Plot 1108 in FIG. 11E illustrates a considerably more uniform spectral distribution across the entire forward hemisphere. Plot 1110 in FIG. 11F illustrates the CIE 1931 (x, y) coordinates of the control device. The coordinates are (0.356, 0.592) at 0° (substrate normal) and (0.330, 0.611) at 60° with a |Δ(x, y)| of (0.026, 0.019), while those of the device with a p-PI scattering layer attached to it are (0.323, 0.613) at 0° and (0.315, 0.618) at 60° with a significantly smaller |Δ(x, y)| of (0.008, 0.005).

Figure 12:
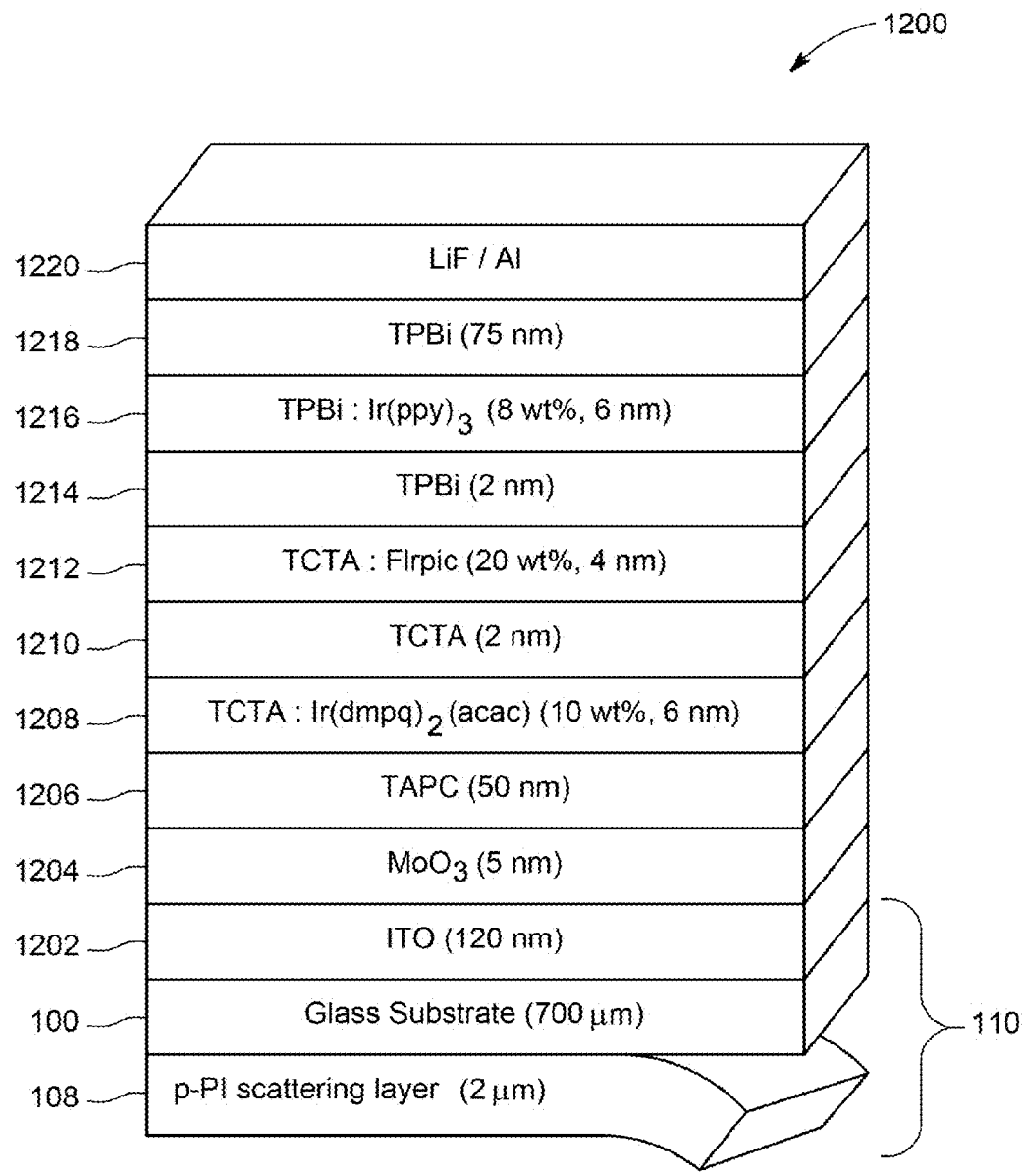
FIG. 12 depicts another device schematic containing the porous film in accordance with exemplary embodiments of the present invention.

FIG. 12 depicts a WOLED device 1200 containing the porous film in accordance with exemplary embodiments of the present invention.

The scattering layer 110 comprises the porous film layer 108 and substrate 100. In some embodiments, the porous film layer 108 is integrated with the substrate 100 (in this embodiment, formed of glass) and an indium tin oxide (ITO) layer 1202.

The phosphorescent dopants Ir(dmpq)2(acac), FIrpic, and Ir(ppy)3 were used as red, blue, and green emitters, respectively in the TCTA layer 1208. In device 1200, excitons are generated in the TCTA layer 1208 and 1210 and TPBi hosts 1214 within the vicinity of the TCTA-TPBi interface to be utilized directly on FIrpic molecules or diffused away from the interface to generate red and green emission, as is well known in the art. A 50 nm thick TAPC layer 1206 and a 75 nm thick TPBi layer 1218 are used as the hole transport and electron transport layers, respectively.

A 5 nm MoO3 layer 1204 is used as a hole injection layer to inject holes into the 50 nm thick TAPC layer 1206. A phosphorescent emission layer 1216 comprises TPBi:Ir (ppy)3. Electron transport layers 1214 and 1218 are composed of TPBi. The cathode 1220 is composed of Lithium fluoride and aluminum.

FIGS. 13A-13F illustrates graphical plots comparing device performance between a control device and the device 1200 in accordance with exemplary embodiments of the present invention.

Figure 13A:
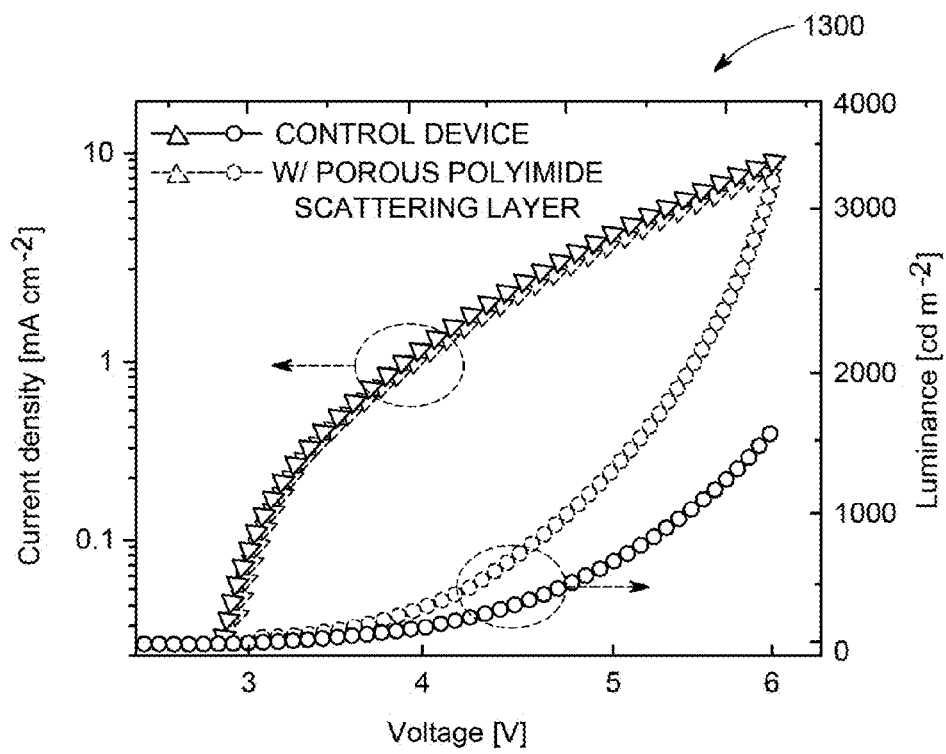
FIGS. 13A-13F illustrate graphical plots comparing broadband device performance between a control device and a device with the polyimide scattering layer.
Figure 13B:
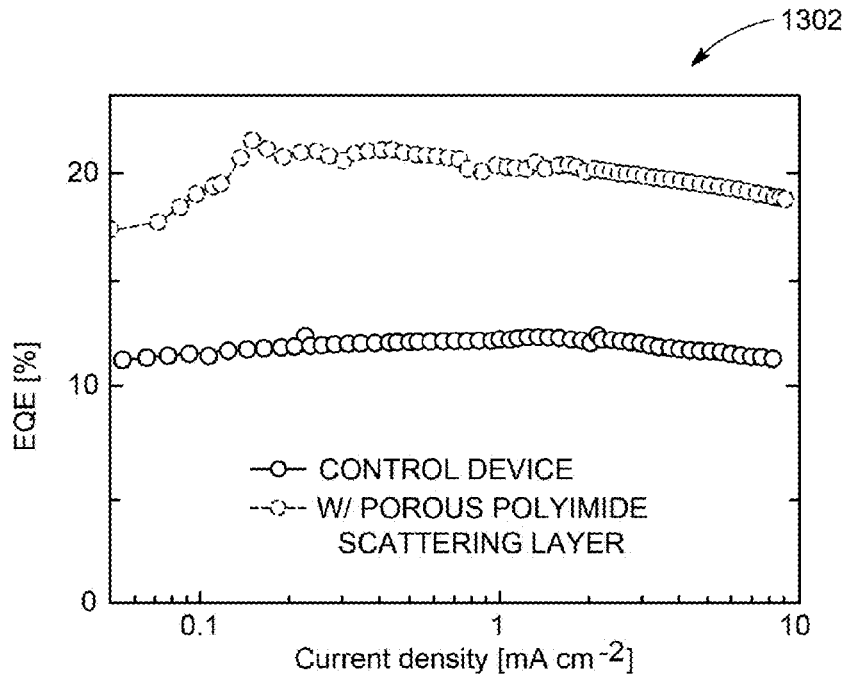
Figure 13C:
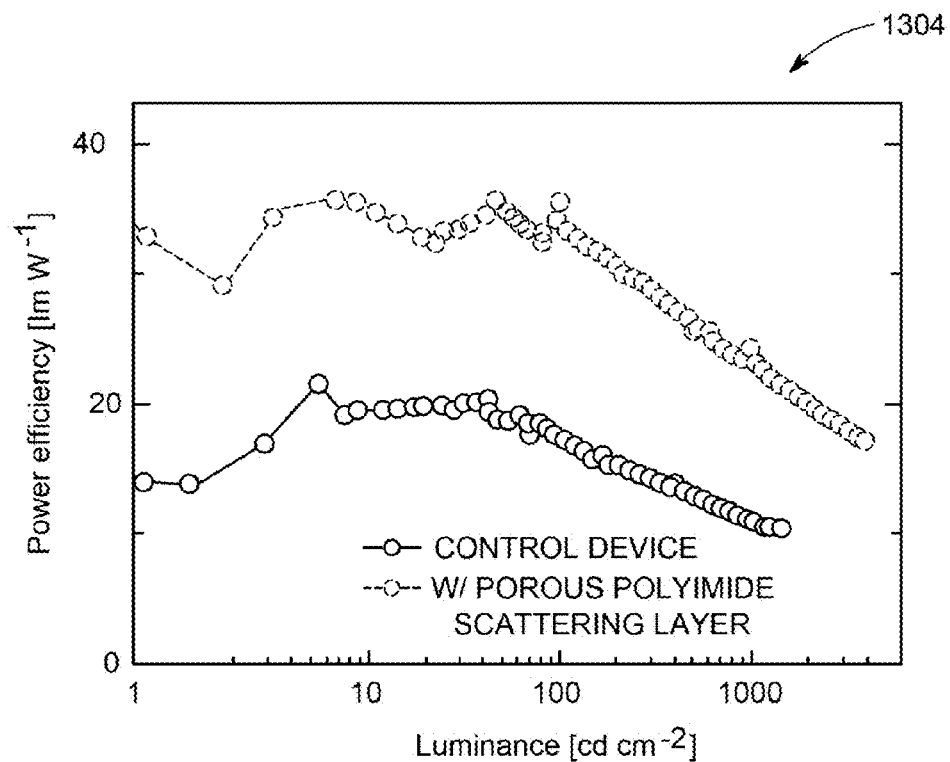

Plot 1300 in FIG. 13A illustrates the current density-luminance-voltage (J-L-V) characteristics of the device 1200. A control device (lacking the porous film 108) had an EQE of 11.9% at a current density of 3 mA cm-2, and the device 1200 showed an increased EQE of 19.0% at the same current density, corresponding to a 60% enhancement of the optical outcoupling efficiency as shown in Plot 1302 in FIG. 13B. This enhancement ratio is similar to that in the previous case of the green OLED, confirming that the absorption loss within the porous film 108 is negligible while the scattering mechanism operates equally well across the broadband white spectrum. The PE at a forward luminance of 100 cd m-2 is 18.0 lm W-1 for the control device, whereas it increased to 32.1 lm W-1 for the device 1200, corresponding to a 78% enhancement as illustrated in graphical plot 1304 in FIG. 13C.

Figure 13D:
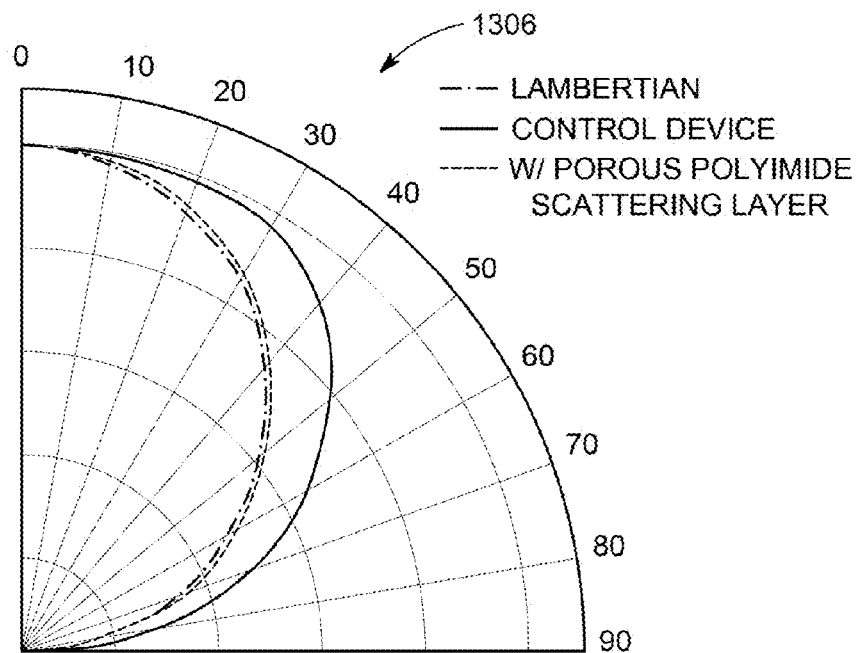
Figure 13E:
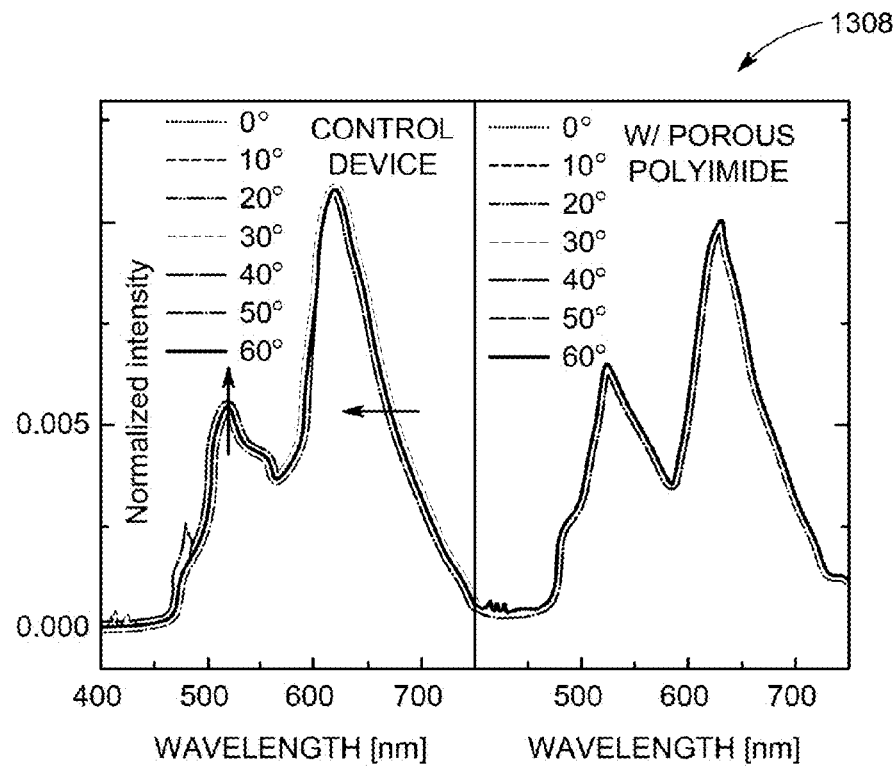
Figure 13F:
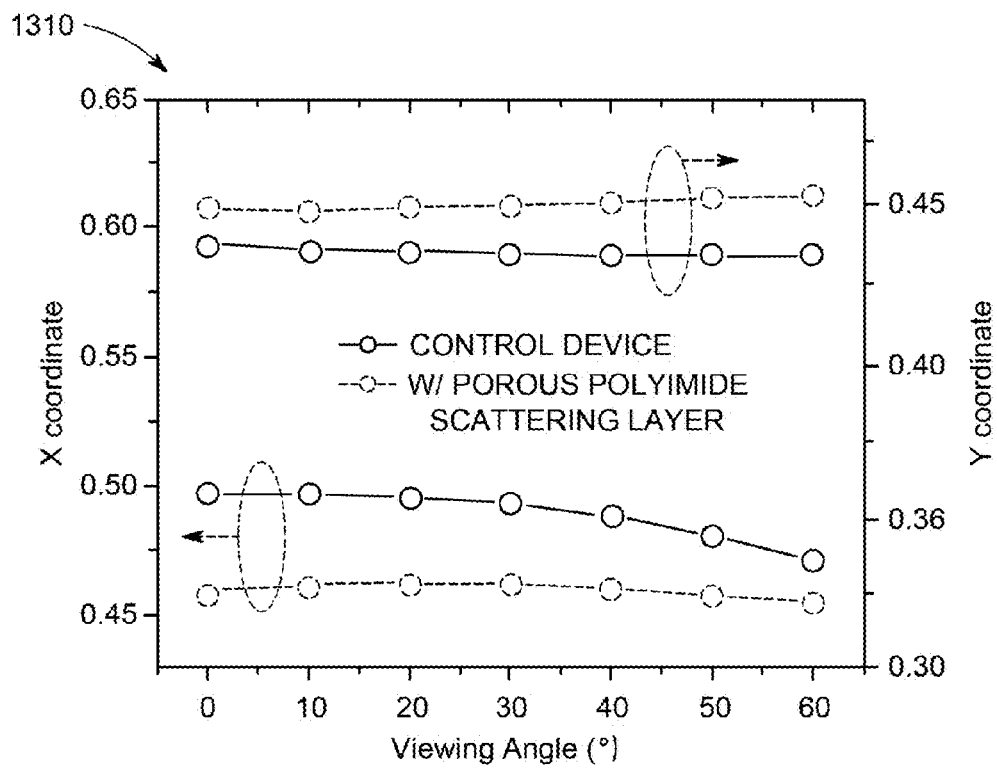

The angular emission intensity profile, EL spectra, and CIE 1931 coordinates of the WOLEDs are illustrated in, respectively, plots 1306 in FIG. 13D, 1308 in FIG. 13E and 1310 in FIG. 13F. The angular intensity profile was initially broader than Lambertian for the control WOLED and was similarly narrowed upon application of the porous film 108 as shown in plot 1306 in FIG. 13D, and the EL spectra at different viewing angles overlap identically as shown in plot 1308 in FIG. 13E. The color consistency across the viewing angle range improved considerably. The CIE (x, y) coordinates of the control device are (0.505, 0.439) at 0° and (0.477, 0.437) at 60° with a |Δ(x, y)| of (0.028, 0.002), while for the WOLED device 1200 they are (0.462, 0.448) at 0° and (0.461, 0.448) at 60° with a notably small |Δ(x, y)| of (0.001, 0.000), ideal for lighting applications, for example.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

All examples described herein are presented in a non-limiting manner. Various modifications and changes may be made as would be obvious to a person skilled in the art having benefit of this disclosure. Realizations in accordance with embodiments have been described in the context of particular embodiments. These embodiments are meant to be illustrative and not limiting. Many variations, modifications, additions, and improvements are possible. Accordingly, plural instances may be provided for components described herein as a single instance. Boundaries between various components are somewhat arbitrary, and particular structures and combinations of elements are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

While the foregoing is directed to embodiments of the present invention, other and further embodiments of the invention may be devised without departing from the basic scope thereof, and the scope thereof is determined by the claims that follow.

The invention claimed is:

1. A process for fabricating a porous film in a scattering layer, the process comprising:
   agitating a Polydimethylsiloxane polymer and solvent solution to introduce air bubbles in the solution;
   dispensing the solvent solution into a flat substrate; and
   curing the solvent solution to trap the air bubbles as air voids, forming a porous film as a scattering layer with the air voids.

2. The process of claim 1, wherein a refractive index of the substrate is greater than a refractive index of the air voids.

3. The process of claim 1, wherein a refractive index of the substrate is greater than approximately 1.45 at wavelengths of light of approximately 300 nm to 1500 nm.

4. The process of claim 1, wherein the substrate is composed of one of flexible glass, flexible plastic, rigid glass or rigid plastic.

5. The process of claim 1, wherein the plurality of voids comprises approximately 0.1% to 90% of volume of the scattering layer.

* * * * *